(12) United States Patent
Chen et al.

(10) Patent No.: US 11,114,815 B1
(45) Date of Patent: Sep. 7, 2021

(54) RARE-EARTH ION-DOPED WAVEGUIDE AMPLIFIERS

(71) Applicant: Acacia Communications, Inc., Maynard, MA (US)

(72) Inventors: Li Chen, Edison, NJ (US); Christopher Doerr, Middletown, NJ (US)

(73) Assignee: Acacia Communications, Inc., Maynard, MA (US)

( * ) Notice: Subject to any disclaimer, the term of this patent is extended or adjusted under 35 U.S.C. 154(b) by 502 days.

(21) Appl. No.: 15/851,185

(22) Filed: Dec. 21, 2017

Related U.S. Application Data

(60) Provisional application No. 62/437,586, filed on Dec. 21, 2016.

(51) Int. Cl.
| | |
|---|---|
| *H01S 3/23* | (2006.01) |
| *H01S 3/067* | (2006.01) |
| *H01S 3/16* | (2006.01) |
| *H01S 3/094* | (2006.01) |

(52) U.S. Cl.
CPC .......... *H01S 3/2308* (2013.01); *H01S 3/0675* (2013.01); *H01S 3/06716* (2013.01); *H01S 3/094003* (2013.01); *H01S 3/1608* (2013.01)

(58) Field of Classification Search
CPC ...... H01S 3/063; H01S 3/0632; H01S 3/1608; H01S 3/2308
See application file for complete search history.

(56) References Cited

U.S. PATENT DOCUMENTS

| | | | |
|---|---|---|---|
| 10,536,219 B1* | 1/2020 | Doerr .................... | H04B 10/40 |
| 2005/0141078 A1* | 6/2005 | Jung ...................... | G02B 6/131 |
| | | | 359/333 |
| 2005/0195472 A1* | 9/2005 | Tang .................... | H01S 3/0632 |
| | | | 359/333 |
| 2007/0133990 A1* | 6/2007 | Kim ..................... | G02B 6/4204 |
| | | | 398/72 |
| 2011/0122485 A1* | 5/2011 | Castagna .............. | H01S 3/0632 |
| | | | 359/344 |
| 2014/0269800 A1* | 9/2014 | Purnawirman .......... | H01S 3/17 |
| | | | 372/40 |
| 2015/0358083 A1* | 12/2015 | Doerr ...................... | G02B 6/00 |
| | | | 398/139 |
| 2015/0372453 A1* | 12/2015 | Yamazaki ........... | H01S 5/02252 |
| | | | 359/344 |
| 2016/0156147 A1* | 6/2016 | Raino ................... | H01S 3/0637 |
| | | | 359/341.3 |
| 2016/0315451 A1* | 10/2016 | de Valicourt ......... | H01S 5/1007 |

OTHER PUBLICATIONS

Agazzi et al., "Monolithic integration of erbium-doped amplifiers with silicon-on-insulator waveguides," Optics Express, Vo. 18, No. 26, p. 27703-27711, 2010.
Purnawirman et al., "C- and L-band erbium-doped waveguide lasers with wafer-scale silicon nitride cavities," Optics Letters, vol. 38, No. 11, pp. 1760-1762, 2013.

\* cited by examiner

*Primary Examiner* — Eric L Bolda
(74) *Attorney, Agent, or Firm* — Joseph D'Angelo

(57) ABSTRACT

A method and apparatus for a silicon photonics chip and a rare-earth-ion-doped waveguide amplifier chip, wherein the rare-earth ion-doped waveguide amplifier is proximate to and optically coupled to the silicon photonics chip.

20 Claims, 5 Drawing Sheets

RARE-EARTH ION-DOPED WAVEGUIDE AMPLIFIERS

RELATED APPLICATIONS

The present application claims the benefit under 35 U.S.C. § 119(e) of U.S. Patent Application Ser. No. 62/437,586, filed Dec. 21, 2016 and entitled "HYBRID INTEGRATION OF ERBIUM DOPED WAVEGUIDE AMPLIFIER IN SILICON PHOTONICS," which is hereby incorporated herein by reference in its entirety.

BACKGROUND

In telecommunications, the amount of information that can be sent over a single optical fiber can be increased by sending information using multiple optical signals, each with a different wavelength. A WDM can be used at a transmitting end of the optical fiber to combine light from a group of optical fibers into the single optical fiber. On the receiving end of the optical fiber, another WDM can be used to demultiplex the multiple optical signals into another group of optical fibers.

SUMMARY

A method and apparatus for a silicon photonics chip and a rare-earth-ion-doped waveguide amplifier chip, wherein the rare-earth ion-doped waveguide amplifier is proximate to and optically coupled to the silicon photonics chip.

BRIEF DESCRIPTION OF THE FIGURES

Various aspects and embodiments of the application will be described with reference to the following embodiments. It should be appreciated that the figures are not necessarily drawn to scale.

DETAILED DESCRIPTION

Figure 1B:
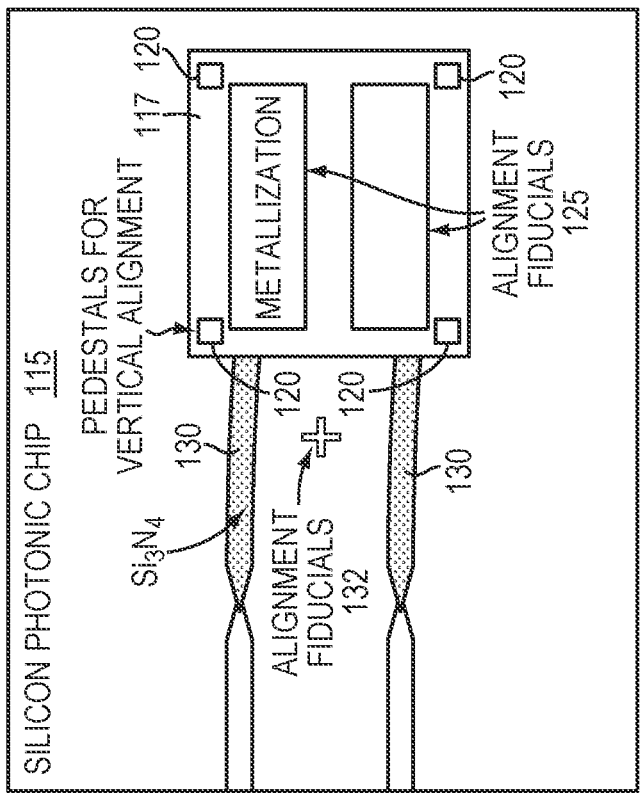
FIG. 1b is a simplified illustration of a silicon photonics chip, according to an embodiment of the current disclosure.

In many embodiments, optical interconnects based on silicon photonics often have a very tight optical power budget. In certain embodiments, silicon photonics may not be able to efficiently introduce additional optical power because of low power requirements in many applications. In most embodiments, trying to introduce higher optical power or an amplifier in silicon optics may require more power than if another material was used to introduce optical gain or amplification. In certain embodiments, this may be because many Group IV materials, such as silicon, have an indirect band gap. In most embodiments, elements with an indirect band gap may not easily or efficiently generate optical gain from added power. In almost all embodiments, it may not be easy to make an optical amplifier in silicon. In many embodiments, the current disclosure has realized that many applications in silicon may benefit from integrated optical gain.

In many embodiments, silicon photonics applications with a tight optical power budget may be benefit from optical gain being introduced on-chip or off-chip for the silicon photonics to achieve an output power for a given application. In some embodiments, technologies for optical transceivers for long-haul and short-reach applications, board-to-board, chip-to-chip or on-chip optical interconnects links for high speed computing, and large-scale on-chip optical switching fabrics may need higher optical power, which may require introduction of additional optical gain.

A typical approach for providing gain is with an external Er-doped fiber amplifier (EDFA). Another conventional approach is to use an integrated semiconductor optical amplifier (SOA). In most embodiments, the current disclosure has recognized that EDFAs are large and expensive to use and may be unsuitable for many applications. In other embodiments, the current disclosure has recognized that SOAs are nonlinear and usually require cooling, where cooling may increase power requirements. In most embodiments, a SOA may not be compatible with silicon photonics or may have power requirements too high for many applications. In some embodiments, the current disclosure has realized that III-V material may have issues with direct integration with silicon photonics including temperature sensitive and hermeticity. In further embodiments, an EDFA or SOA may require many fiber splices, which may be a cause of additional failures.

In certain embodiments, outside of silicon photonics, the current disclosure has recognized that an Er-doped waveguide amplifier (EDWA) may be used for introducing optical gain. In most embodiments herein, an EDWA may refer to an EDWA chip and those terms may be used interchangeable herein. In many embodiments, an EDWA chip may be a chip with an ER doped waveguide that may function as an optical amplifier. In other embodiments, the current disclosure has realized that other rare-earth metals may be beneficial to dope a waveguide amplifier.

In further embodiments, the current disclosure has realized that an EDWA or other rare-earth metal doped amplifiers may not be allowed inside a foundry that produces silicon photonics. In most embodiments, the current disclosure has realized that EDWAs are not easily integrated with other silicon photonic components. In certain embodiments, an EDWA fabrication process may not be CMOS-compatible. In most embodiments, the current disclosure recognizes that a silicon photonics foundry is unlikely to include the monolithic integration process for the EDWA as CMOS foundries do not want erbium to contaminate their tools. Conventionally, erbium has been found to contaminate silicon foundries and introduce impurities that cause chips to fail or malfunction. As well, the typical temperature window to create EDWAs is sufficiently high to make it difficult to integrate it without affecting the performances of other silicon photonic components. In most embodiments, the current disclosure has realized that there may be similar problems with other rare-earth metal doped waveguide amplifiers.

In most embodiments, the current disclosure has realized that it would be beneficial to use a rare-earth metal doped waveguide amplifier with silicon photonics. In particular embodiments, the current disclosure has realized that it would be beneficial to use an erbium-doped waveguide amplifier. In almost all embodiments, the present disclosure may provide a way to integrate rare-earth metal doped waveguide amplifiers with silicon photonics. In some embodiments, the present disclosure may enable integrated erbium-doped waveguide amplifiers in silicon photonics. In many embodiments, the present disclosure may enable an EDWA integrated into an uncooled silicon photonic transceiver or switch. In some embodiments, a rare-earth metal may include erbium. In other embodiments, a rare-earth metal may be neodymium, ytterbium, thulium, praseodymium, or holmium.

In many embodiments, the current disclosure may enable hybrid integration of uncooled optical gain to a silicon photonic chip. In other embodiments, the current disclosure may circumvent technical challenges of integrating an EDWA monolithically with other silicon photonic components. In many embodiments, a silicon photonic chip, a rare-earth metal doped waveguide amplifier, and a pump laser chip may be individually optimized and fabricated to achieve their best performance.

In certain embodiments, a silicon photonic chip, an EDWA chip, and a pump laser chip may be tested individually before integration. In some embodiments, a pump laser and a rare-earth metal doped waveguide amplifier may be bonded in a trench on a silicon wafer and individually hermetically sealed.

In certain embodiments, the current disclosure may enable a silicon photonics chip to have two or more layers of waveguides. In some embodiments, two layers of a silicon photonics chip may be silicon and silicon nitride. In certain embodiments, a three-waveguide-layer structure may be used.

In certain embodiments, a bottom layer may be a silicon waveguide, a middle layer may be a $Si_3N_4$ waveguide, and a top layer may be an $Al_2O_3$ rare-earth metal doped waveguide. In alternative embodiments, a top layer may be an $Al_2O_3$ passive waveguide without doping. In some embodiments, light may be coupled between layers adiabatically using inverse tapers. In certain embodiments a laser may be coupled to one or more of the layers. In a particular embodiment with three layers, a bottom layer may be 220 nm thick, a middle layer may be 300 nm thick, and a top layer may be 1000 nm thick. In some embodiments, it may be beneficial to have a $Si_3N_4$ waveguide, which, unlike Si, is transparent to 980 nm light. In certain embodiments, a $Si_3N_4$ waveguide may have an intermediate refractive index between silicon and $Al_2O_3$:Er, which may make coupling easier.

In certain embodiments, an $Al_2O_3Al_2O_3$ waveguide may be a channel waveguide that is fully etched. In many embodiments, a silicon photonics chip may have one or more trenches in the chip. In certain embodiments, a trench may have a bottom metallization for bonding. In most embodiments, a trench may have a pedestal or mechanic stop for vertical alignment. In many embodiments, a mechanical stop may provide accurate vertical alignment between a silicon photonic waveguide and a second chip. In many embodiments, mechanic stops may provide accurate vertical alignment between a silicon photonic waveguide and an Er-doped waveguide. In certain embodiments, a mechanical stops may provide accurate vertical alignment between a silicon photonic waveguide and a laser.

In some embodiments, a laser may be flip-chip bonded into a trench of a silicon photonics chip. In certain embodiments, a flip-chip bonding tool may use alignment markers (fiducials) on a silicon photonic chip and a chip to be flip-chip bonded for in-plain alignment. In many embodiments, a flip-chip bonding tool may use alignment markers (fiducials) on a silicon photonic chip and an EWDA chip for in-plain alignment. In many embodiments, a flip-chip bonding tool may use alignment markers (fiducials) on a silicon photonic chip and a laser for in-plain alignment. In most embodiments, metallization may be performed on a top side of an EWDA chip and a bottom of a silicon photonic trench. In some embodiments, metallization may be performed on a top side of a rare-earth ion doped wavelength chip and a bottom of a silicon photonic trench. In some embodiments, metallization may be Au. In certain embodiments, metallization may be AuSn. In many embodiments, metallization may be Copper. In alternative embodiments, metallization may be Aluminum. In further embodiments, metallization may be solder. In other embodiments, metallization may be a material used for flip-chip bonding. In many embodiments, fiducials may be patterned on waveguide layers.

In other embodiments, an EDWA chip may be flip-chip bonded into a trench of a silicon photonics chip. In further embodiments, an EDWA chip may be side bonded to a silicon photonics chip. In some embodiments, an EDWA chip may have alignment fiducials on a waveguide layer. In certain embodiments, a rare-earth ion doped waveguide amplifier chip may have alignment fiducials on a waveguide layer. In other embodiments, an EDWA waveguide may be fabricated on a substrate such as quartz. In other embodiments, an EDWA waveguide may be fabricated on a substrate such as a silicon-on-insulator substrates. In other embodiments, an EDWA waveguide may be fabricated on a substrate such as a silicon substrate.

In certain embodiments, a silicon photonic chip may be butt-coupled to a rare-earth metal doped chip from the side. In further embodiments, chips may be coupled using face-to-face vertical light coupling using a grating coupler. In other embodiments, chips may be coupled using light turning mirrors on each side. In still further embodiments, chips may be coupled using lenses between the chips. In most embodiments, a laser may be integrated or coupled in a similar manner to how chips may be coupled.

In some embodiments, a rare-earth metal doped waveguide amplifier chip may be flip-chip bonded into a trench of a silicon photonics chip. In certain embodiments, there may be pedestals in a trench to provide a height reference. In other embodiments, a rare-earth metal doped waveguide amplifier chip may be edge coupled or side bonded to a silicon photonics chip. In many embodiments, a flip-chip bonded laser may be coupled to silicon photonics waveguides. In most embodiments, a flip-chip bonded EDWA chip may be coupled to silicon photonics waveguides. In certain embodiments, an edge coupled or side bonded EDWA chip may be coupled to silicon photonics waveguides. In most embodiments, a flip-chip bonded a rare-earth metal doped waveguide amplifier chip may be coupled to silicon photonics waveguides. In certain embodiments a side bonded or edge coupled rare-earth metal doped waveguide amplifier chip may be coupled to silicon photonics waveguides.

In some embodiments, flip-chip bonding may use passive alignment. In other embodiments, side bonding or edge coupling may use passive alignment. In other embodiments, side bonding or edge coupling may use active alignment. In certain embodiments, a bonding material may be solder bumps. In other embodiments, a bonding material may be an AuSn alloy. In further embodiments, other flip-chip or side bonding materials may be used. In certain embodiments, a silicon photonics chip and a rare-earth chip may be flip-chip bonded to a substrate or another chip.

In certain embodiments, passive bonding of a waveguide may be aligned to the silicon nitride waveguide using patterned fiducials. In other embodiments, passive bonding of a waveguide may be aligned to the silicon nitride waveguide may use mechanical stops. In most embodiments, passive alignment may mean that a chip may be bonded to another chip without turning on optical power. In some embodiments, passive alignment may mean that one or more chips may be aligned by features. In many embodiments, passive alignment may use one or more cameras to passively align one or more chips. In some embodiments, a first waveguide may be placed above another waveguide and the first waveguide may be tapered down to the other waveguide.

In some embodiments, a laser may be a 980-mn pump laser. In other embodiments, a laser may be a 1480-nm pump laser. In certain embodiments, a pump laser may be GaAs quantum laser. In many embodiments, a laser may not require cooling. In most embodiments, a rare-earth metal doped waveguide amplifier chip may not require cooling. In most embodiments, an EDWA amplifier chip may not require cooling. In some embodiments, an EDWA may be made of Er-doped $Al_2O_3$ waveguide with $SiO_2$ cladding on a silicon substrate. In other embodiments, a chip may be a TDWA, where T may be thulium and a host may be a host oxide. In further embodiments, oxides other than O3 may be used.

In some embodiments, a signal light may be coupled from a silicon layer to a silicon nitride layer adiabatically. In certain embodiments, coupling may be performed using inverse tapers. In certain embodiments, a wave division multiplexer (WDM) combiner may combine signal light and pump light. In many embodiments, combined light may be stabilized by a tunable grating. In some embodiments, a grating or ring stabilizer may provide a weak reflection to a laser at a narrow frequency band, which may stabilize the laser as temperature changes. In most embodiments, a center wavelength of a grating/ring may be tuned by an integrated thermal heater. In certain embodiments, a grating or ring may be made by silicon nitride waveguides. In many embodiments, for a laser integration/coupling, a silicon chip can use light from a commercial packaged laser using an optical fiber. In certain embodiments, a commercial packaged laser may use a fiber grating to stabilize the laser.

In other embodiments, laser light may be stabilized by a ring wavelength stabilizer. In most embodiments, a grating may lock a wavelength of a laser. In many embodiments, a grating may control for changes in temperatures. In most embodiments, a grating may feedback to a laser and lock a wavelength to a range.

In some embodiments, combined light may be coupled into a EDWA chip and amplified by the EDWA chip. In certain embodiments, when an EDWA is flip-chip bonded, a waveguide of the EDWA and silicon nitride couples may be angled to increase return loss. In many embodiments, increasing return loss may decrease reflection. In most embodiments, increased reflection may create a laser. In some embodiments, an optically pump Er doped waveguide laser (EDWL) may be formed using a EDWA chip and an external laser cavity formed in a silicon chip. In many embodiments, optical feedback may be provided to ends of an EDWA chip from a grating or a Sagnac loop reflector formed on silicon or Si3n4 waveguide. In further embodiments, a tunable laser may be realized by including a tunable wavelength filter using ring resonators, Mach-Zehnder interferometers, or gratings.

In certain embodiments, at an output of an EDWA, light may be coupled from a silicon nitride layer to the silicon layer. In many embodiments, residual light from a laser at 980 may be absorbed by the silicon waveguide. In certain embodiments, a discreet optical isolator may be integrated at an output of an EDWA chip to isolate the EDWA chip from reflected light. In some embodiments, light in the system may be collimated. In certain embodiments, collimation may be accomplished by placing a lens adjacent to an EDWA waveguide port and another lens adjacent to a SiN port with an optical isolator in between. In certain embodiments, an EDWA chip may contain multiple independent EDWAs. In other embodiments, bonding or coupling may include face-to-face vertical light coupling which may use a grating coupler or light turning mirrors on each side, and coupling may use lens between the chips.

Figure 1A:
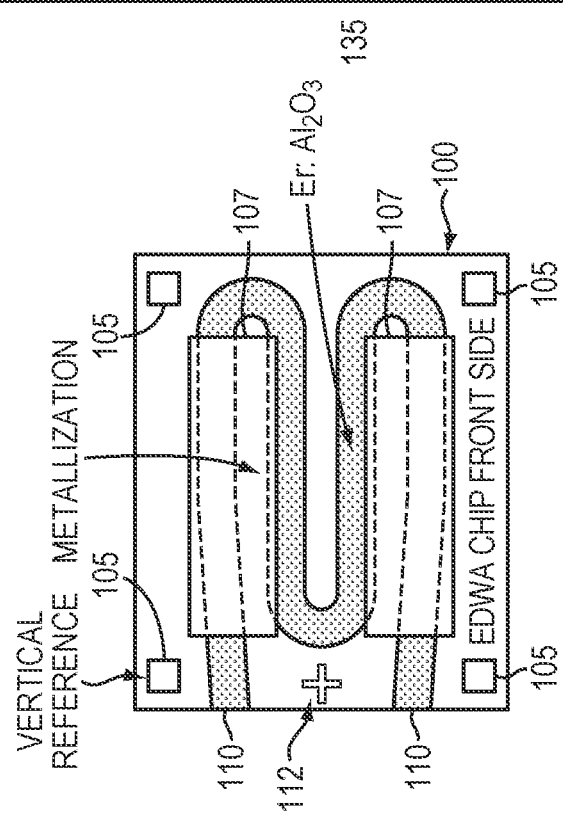
FIG. 1a is a simplified illustration of an EDWA chip configured to be flip-chip bonded, according to an embodiment of the current disclosure.

Refer now to the example embodiment of FIG. 1a, which illustrates a sample EDWA chip as viewed from a front side. EDWA Chip 100 has four vertical references 105, metallization 107, and waveguide 110 made of Al2O3. In the embodiment of FIG. 1a, the chip is viewed on the front side which may be flip-chip bonded on to another chip. Vertical references 105 provide a passive alignment tool so that the chip may be passively aligned with another chip. Alignment fiducial 112 may also be used to passively align EDWA chip 100 to another chip using a camera.

Refer now to the example embodiment of FIG. 1b, which illustrates a silicon photonics chip with a trench. Silicon photonics chip 115 has trench 117 that is able to receive another chip, such as EDWA chip of FIG. 1a. Trench 117 has pedestals/fiducials 120 and metallization 125. Fiducials 120 provide a passive alignment tool to passively align a chip that is flip-chip bonded in trench 117. Alignment fiducials 132 provide a tool to passively align a chip that is flip-chip bonded in trench 117. Waveguides Si3N4 130 are set along a facet of trench 117 to align with waveguides that are in a chip that is flip chip bonded to silicon photonics chip 115. In a particular embodiment, waveguides Si3N4 130 are configured to optically connect with waveguides Er:Al2O3 110 of EDWA chip 100 when EDWA chip 100 is flip-chip bonded to silicon photonics chip 115.

In many embodiments, a laser chip may be a laser chip with AU metal pads on a top surface of the laser chip. In some embodiments, a laser chip may have similar alignment and vertical markers as the EDWA chip of FIG. 1a. In certain embodiments, a silicon photonics chip may have a trench, alignment fiducials, and pedestals to receive a flip-chip bonded laser similar to that of FIG. 1b configured to receive an EDWA chip. In some embodiments, a laser waveguide may be bent near a facet to remove reflection. In most embodiments, as used herein, a facet may refer to a side of an object.

Figures 2A, 2B:
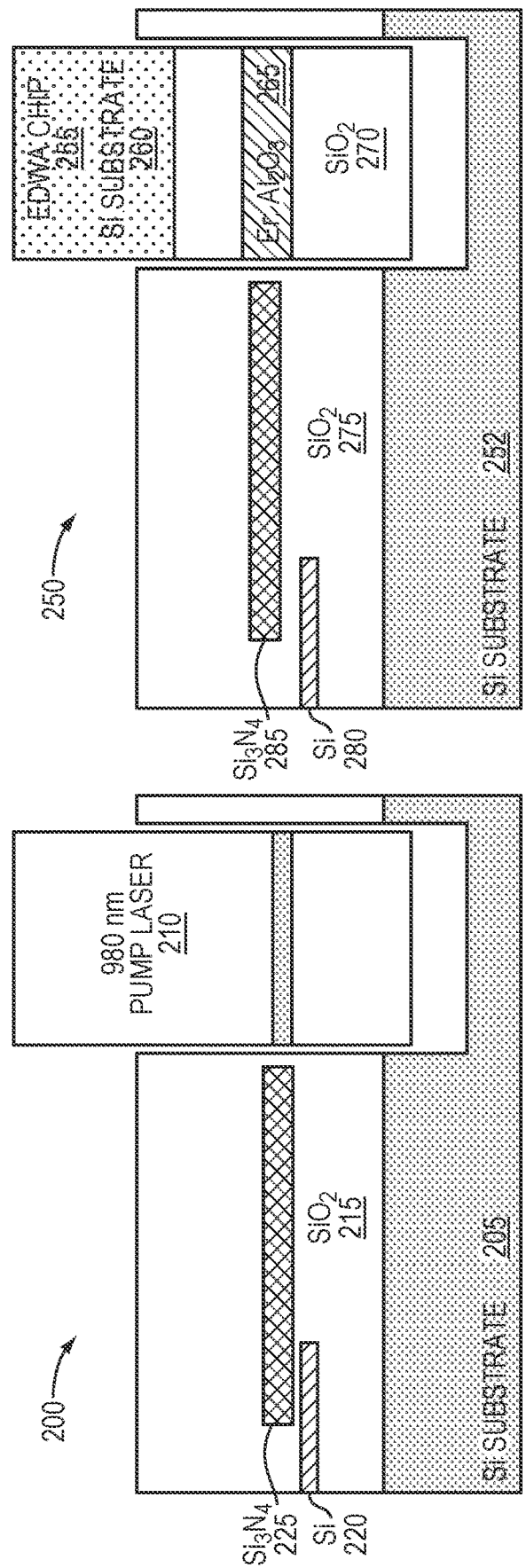
FIG. 2a is a simplified illustration a cross-sectional view of a laser flip-chip bonded to a silicon photonics chip, according to an embodiment of the current disclosure.
FIG. 2b is a simplified illustration a cross-sectional view integrated EDWA flip-chip bonded to a silicon photonics chip, according to an embodiment of the current disclosure.

Refer now to the example embodiment of FIG. 2a, which represents a cross sectional view of a laser flip-chip bonded to a silicon photonics chip. In the example embodiment of FIG. 2a, silicon substrate 205 has 980 nm pump laser flip chip bonded to a trench in Si substrate 205. Si substrate 205 has SiO2 layer 215 on Si substrate 205. Si 220 is on SiO2 layer 215. Si3N4 layer is over Si waveguide 220 and SiO2 substrate 215. In this example embodiment, waveguides in 980 nm pump laser 210 have been passively aligned with waveguide Si3N4 225 using fiduciaries, vertical references, and pedestals.

In some embodiments, a wafer may be a silicon-on-insulator wafer with a silicon substrate, a few microns of SiO2 spacer and a thin silicon layer on the top. In many embodiments, after patterning a silicon waveguide layer, more SiO2 may be added. In some embodiments, after adding SiO2, Si3N4 can be deposited and patterned. In certain embodiments, after Si3N4 can be deposited and patterned, more SiO2 may be deposited as passivation. In certain embodiments, "silicon-on-insulator" may refer to a wafer with a few microns of SiO2 spacer and a thin silicon layer on the top.

Refer now to the example embodiment of FIG. 2b, which represents a cross sectional view of an EDWA chip, such as that of the embodiment of FIG. 1a, flip chip bonded to a silicon photonics chip, such as that of the embodiment of FIG. 1b. In the embodiment of FIG. 1b, EDWA chip 255 has been clip chip bonded to Si substrate 252. EDWA chip 255 has Si substrate 260, Er:Al2O3 waveguide 265 and SiO2 270. Si substrate 252 has SiO2 275. Si 280 is layered over SiO2 275. Waveguide Si3N4 285 has been passively aligned to waveguide Er:Al2O3 of EDWA chip 255. In the embodiments of FIGS. 2a and 2b, the bonding material is solder bumps. In other embodiments, an EDWA waveguide may be aligned using mechanical stops.

Figure 3:
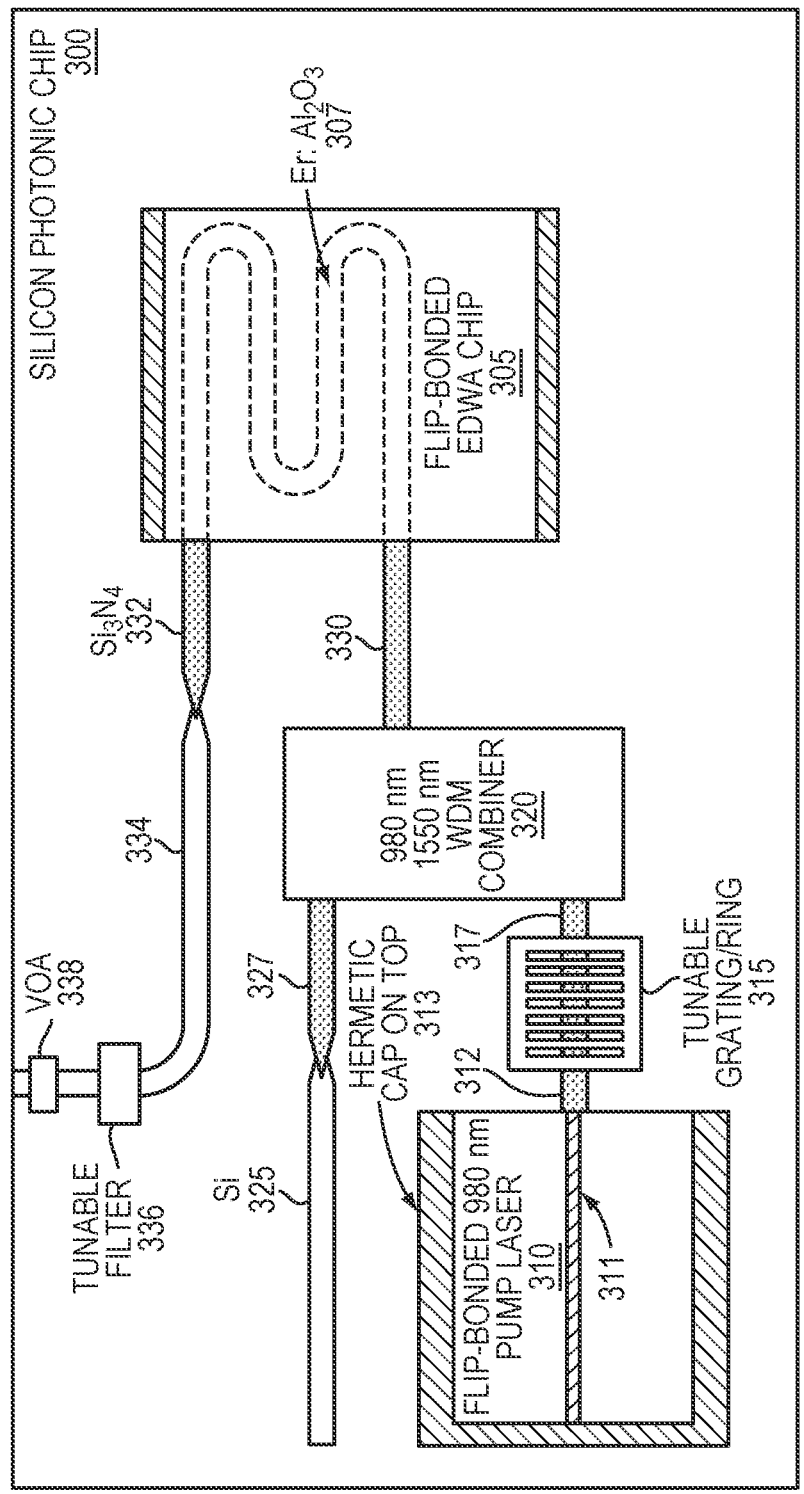
FIG. 3 is a simplified illustration integration of a flip-chip bonded EDWA, a flip-chip bonded pump laser, and silicon photonics chip, according to an embodiment of the current disclosure.

Refer now to the example embodiment of FIG. 3, which illustrates a silicon photonics chip that has been flip chip bonded with a laser and EDWA chip. In the example embodiment of FIG. 2, EDWA chip 305 has been flip-chip bonded to a trench in silicon photonics chip 300, such as trench 117 in FIG. 1b. Flip-chip bonded EDWA chip 305 has waveguide Er:Al2O3 307. Waveguide Er:Al2O3 307 has been passively aligned to Si3N4 waveguides 330 and 332 when it was flip-chip bonded to silicon photonics chip 300. 980 nm pump laser 310 has been flip-chip bonded to a trench silicon photonics chip 300, such as trench 117 in FIG. 1b. Flip-chip bonded 980 nm pump laser is hermetically sealed by hermetic cap on top 312. In other embodiments, the pump laser may not be hermetically sealed.

Returning the embodiment of FIG. 3, waveguide 311 of flip-chip bonded 980 nm pump laser is aligned with and optically coupled to waveguide 313 in silicon photonics chip. Waveguide 312 is optically coupled to tunable grating 315. Tunable grating 315 is optically coupled to waveguide 317. Waveguide 317 is optically coupled to 980 nm 1550 nm WDM combiner 320. 980 nm 1550 nm Wave division multiplexor (WDM) combiner 320 is optically coupled to waveguide 330 and waveguide 327. Waveguide 327 is optically coupled to Si 325. Waveguide 332 is optically coupled to waveguide 334, which is optically coupled to tunable filter 336. Tunable filter 336 is in turn optically coupled to variable optical attenuator (VOA) 338. FIG. 3 shows forward pumping of the EDWA. In other embodiments, it may be possible to use backward pumping. In most embodiments, forward pumping may result in better noise figure and backward pumping may result in higher output power.

Figure 4:
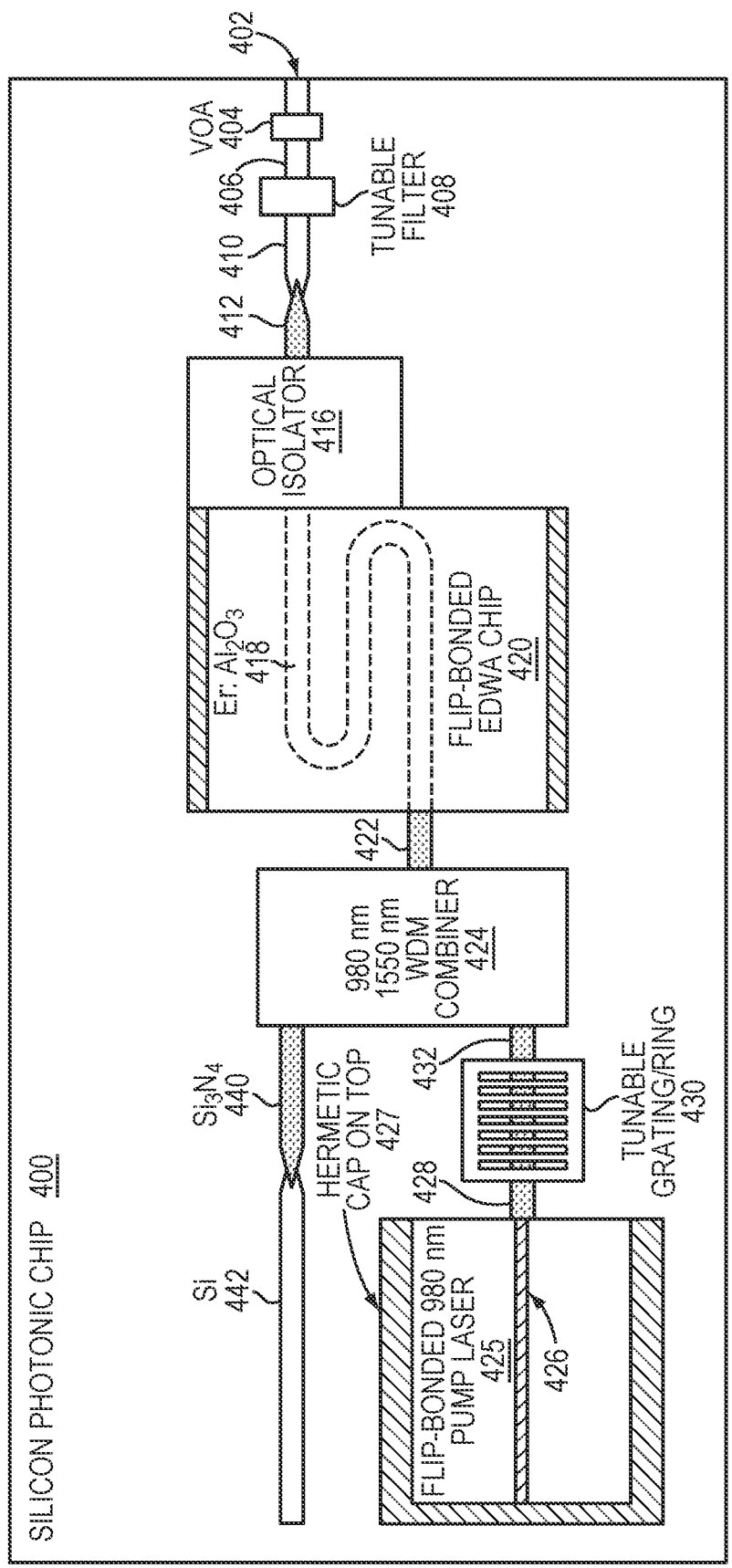
FIG. 4 is a simplified illustration of a discrete optical isolator integrated at an output of an EDWA chip to isolate the EDWA from reflected light, according to an embodiment of the current disclosure.

Refer now to the example embodiment of FIG. 4, which illustrates an alternative configuration of a silicon photonics chip with a flip-chip bonded laser and flip-chip bonded EDWA with an optical isolator. Waveguide 402 is optically coupled to VOA 404, which is optically coupled to waveguide 406, which is optically coupled to tunable filter 408. Optical filter 408 is optically coupled to waveguide 410, which is coupled to waveguide 412. Waveguide 412 is optically coupled to optical isolator 416 which connects to flip-chip bonded EDWA chip 420 through waveguide Er:Al2O3 418. Flip-chip bonded EDWA chip 420 is connected to waveguide 422 through waveguide Er:Al2O3 418. Waveguide 422 is optically connected to 980 nm 155 nm WDM combiner 424. Flip-chip bonded 980 nm pump laser 425 has waveguide 426 which is optically coupled with waveguide 428, which is optically coupled to tunable grating 430, which is optically coupled to waveguide 432. Flip-chip bonded 980 nm pump laser 425 is hermitically sealed by hermetic cap 427. Waveguide 432 is optically coupled to 980 nm 155 nm WDM combiner 424 as is waveguide 422. 980 nm 155 nm WDM combiner 424 is optically coupled to Si3N4 waveguide 440, which is optically coupled to waveguide Si 442. In the embodiment of FIG. 4, a discrete optical isolator is integrated at the output of the EDWA chip to isolate the EDWA from reflected light. In this embodiment, as magneto-optic isolators are usually on the order of 0.5 mm thick or more, the light passing through isolator 416 is collimated by placing a lens adjacent to the EDWA waveguide port and another lens adjacent to the SiN 422 with the optical isolator in between, in a trench. FIG. 4 shows forward pumping of the EDWA. In other embodiments, backward pumping may be used.

Figure 5:
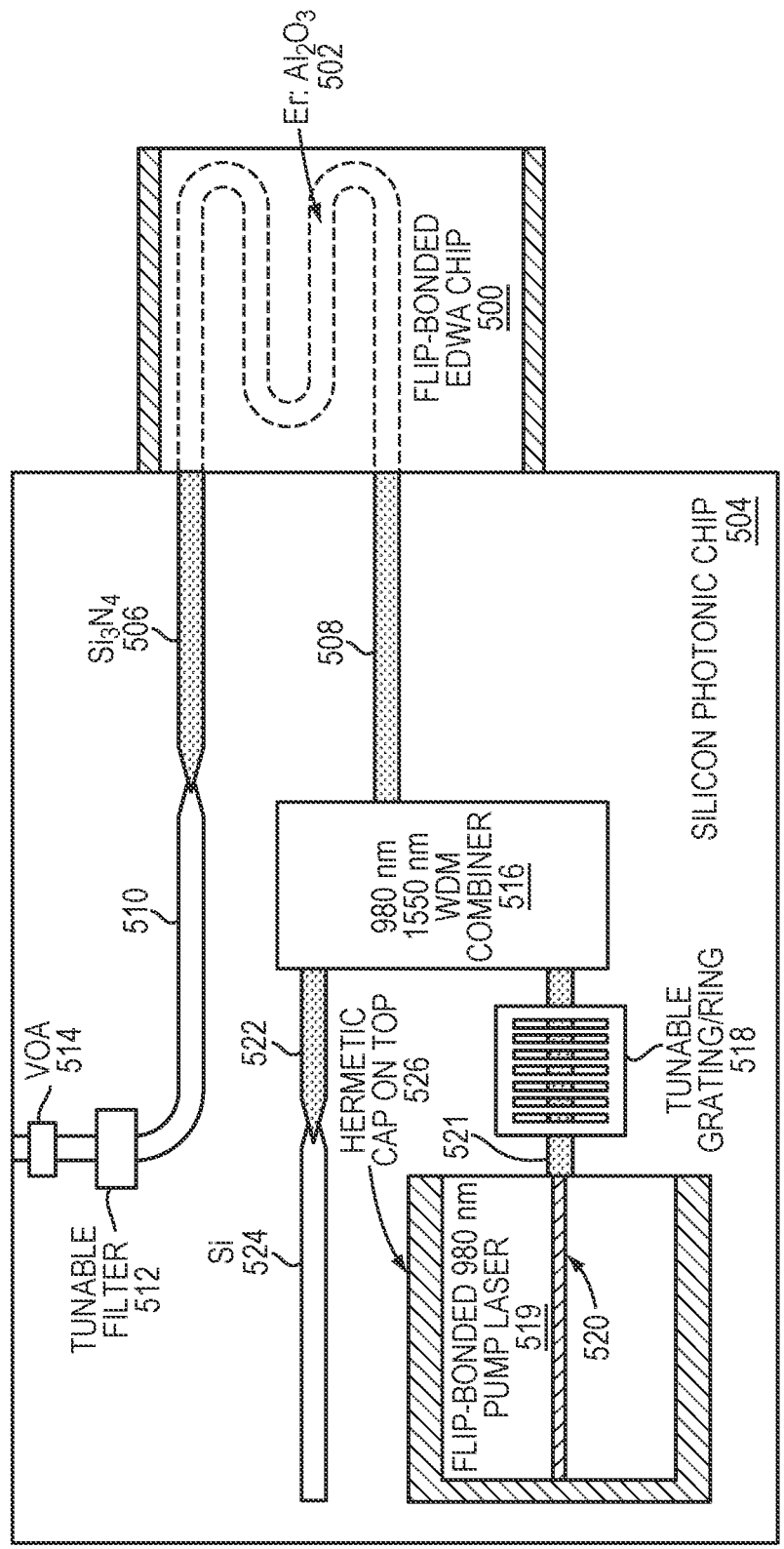
FIG. 5 is simplified illustration integration of an EDWA, pump laser, and silicon photonics chip, where the EDWA has been side bonded to the silicon photonics chip, according to an embodiment of the current disclosure.

Refer now to the example embodiment of FIG. 5, which illustrates a side coupling of an EDWA chip to a silicon photonics chip. In the example embodiment of FIG. 5, EDWA chip 500 has waveguide Er:Al2O3 and has been side bonded to silicon photonics chip 504. Silicon photonics chip 504 has silicon waveguides 506 and 508 which have been aligned to waveguide ErAl2O3 502. Waveguide 508 is optically coupled with 980 nm 1550 nm WDM combiner 516. 980 nm 1550 nm WDM combiner 516 is optically coupled to waveguide 521 which passes through tunable grating 518. Waveguide 521 is connected to flip-chip bonded 980 nm pump laser 519 though waveguide 520. 980 nm pump laser 519 is hermetically sealed by hermetic copay 526. 980 nm 1550 nm WDM combiner 516 is optically coupled to waveguide 522, which is optically coupled to waveguide 524. Waveguide 506 is connected to waveguide 510 which passes through tunable filter 512 and VIA 514. The example embodiment of FIG. 5 uses forward pumping. In other embodiments, backward pumping may be used.

In further embodiments, an EDWA chip may be face to face vertically coupled using a grating coupler. In other embodiments, light turning mirrors on each side may be used where there are coupling lenses between each chip. In further embodiments, a laser may be coupled using any of the techniques described herein. In further embodiments, although specific examples may be given with an EDWA chip, any rare-earth ion doped waveguide amplifier chip may be coupled using the techniques described herein.

In many embodiments, a silicon photonic chip and a doped waveguide may be part of the same substrate. In most embodiments, a silicon photonics chip and a doped waveguide may be coupled by optical fiber. In certain embodiments, on chip may be on top of another. In further embodiments, each chip may be supported directly or indirectly by a common substrate.

Having thus described several aspects and embodiments of the technology of application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An apparatus comprising:
a silicon photonics chip; and
a rare-earth-ion-doped waveguide amplifier chip; wherein the rare-earth ion-doped waveguide amplifier is proximate to and optically coupled to the silicon photonics chip; wherein the rare-earth-ion-doped waveguide amplifier chip is mechanically aligned to the silicon photonics chip.

2. The apparatus of claim 1 further comprising a laser optically coupled to the silicon photonics chip.

3. The apparatus of claim 1 further comprising a laser optically coupled to the rare-earth ion-doped waveguide chip.

4. The apparatus of claim 1 wherein the rare-earth ion-doped chip is butt-coupled to the silicon photonics chip.

5. The apparatus of claim 1 wherein the rare-earth ion is erbium.

6. The apparatus of claim 2 wherein the laser is a 980 nm pump laser.

7. The apparatus of claim 6 wherein silicon photonics chip has one or more alignment features and the rare-earth ion doped waveguide amplifier is positioned to be aligned to at least one of the one or more alignment features of the silicon photonics chip.

8. The apparatus of claim 7 wherein the laser is positioned to be aligned to a second of the one or more alignment features of the silicon photonics chip.

9. The apparatus of claim 1 wherein the rare-earth ion-doped waveguide chip is placed in a trench on the silicon photonics chip.

10. The apparatus of claim 9 wherein the rare-earth chip has waveguide ports and one or more of the waveguide ports come to facet.

11. The apparatus of claim 9 wherein the silicon photonics chip has a pump coupler.

12. A method comprising:
optically coupling a silicon photonics chip to a rare-earth ion-doped waveguide amplifier chip by mechanically aligning the rare-earth-ion-doped waveguide amplifier chip to the silicon photonics chip.

13. The method of claim 12 further comprising:
optically coupling a laser to the silicon photonics chip.

14. The method of claim 12 further comprising:
optically coupling a laser to the rare-earth ion-doped waveguide chip.

15. The method of claim 12 further comprising:
butt-coupling one or more waveguides of the rare-earth ion-doped chip to one or more waveguides of the silicon photonics chip.

16. The method of claim 12 wherein the rare-earth ion is erbium and the laser is a 980 nm pump laser.

17. The method of claim 12 further comprising:
positioning one or more of alignment features of the silicon photonics chip to one or more of alignment features of the rare-earth ion doped waveguide amplifier to align the rare-earth ion doped waveguide amplifier to the silicon photonics chip for optical coupling.

18. The method of claim 12 wherein the laser is positioned to align to a second of the one or more alignment features of the silicon photonics chip.

19. The apparatus of claim 1 wherein the rare-earth ion doped waveguide amplifier is flip-chip bonded to the silicon photonics chip.

20. The apparatus of claim 1 wherein the silicon photonics and rare-earth-ion-doped waveguide amplifier are on a same substrate.

* * * * *